United States Patent
Polcik et al.

(10) Patent No.: US 10,109,468 B2
(45) Date of Patent: Oct. 23, 2018

(54) SPUTTERING TARGET

(71) Applicants: PLANSEE COMPOSITE MATERIALS GMBH, Lechbruck am See (DE); OERLIKON SURFACE SOLUTIIONS AG, PFAEFFIKON, Pfaeffikon (CH)

(72) Inventors: Peter Polcik, Reutte (AT); Sabine Woerle, Pflach (AT); Siegfried Krassnitzer, Feldkirch (AT); Juerg Hagmann, Sax (CH)

(73) Assignees: Plansee Composite Materials GmbH, Lechbruck am See (DE); Oerlikon Surface Solutions AG, Pfaeffikon, Pfaeffikon (CH)

( * ) Notice: Subject to any disclaimer, the term of this patent is extended or adjusted under 35 U.S.C. 154(b) by 0 days.

(21) Appl. No.: 15/319,022

(22) PCT Filed: Jun. 26, 2015

(86) PCT No.: PCT/EP2015/001298
§ 371 (c)(1),
(2) Date: Dec. 15, 2016

(87) PCT Pub. No.: WO2015/197196
PCT Pub. Date: Dec. 30, 2015

(65) Prior Publication Data
US 2017/0133209 A1    May 11, 2017

Related U.S. Application Data

(60) Provisional application No. 62/017,909, filed on Jun. 27, 2014.

(51) Int. Cl.
*H01J 37/34* (2006.01)
*C23C 14/34* (2006.01)
(Continued)

(52) U.S. Cl.
CPC ........ *H01J 37/3435* (2013.01); *C23C 14/067* (2013.01); *C23C 14/3485* (2013.01);
(Continued)

(58) Field of Classification Search
CPC .............. C23C 14/067; C23C 14/3407; C23C 14/3485; C23C 14/35; H01J 37/3426; H01J 37/3435; H01J 37/3467
(Continued)

(56) References Cited

U.S. PATENT DOCUMENTS 4,209,375 A * 6/1980 Gates ................. B23K 35/3013
 204/192.15
4,341,816 A * 7/1982 Lauterbach .......... B23K 35/001
 204/192.15
(Continued)

FOREIGN PATENT DOCUMENTS

CN 101518851 A 9/2009
CN 101745710 A 6/2010
(Continued)

OTHER PUBLICATIONS

KIPO written opinion dated Apr. 5, 2018.

*Primary Examiner* — Rodney G McDonald
(74) *Attorney, Agent, or Firm* — Laurence A. Greenberg; Werner H. Stemer; Ralph E. Locher

(57) ABSTRACT

A target, in particular a sputtering target, includes a target plate of a brittle material and a back plate. The back plate is connected to the target plate over an area and the target plate has micro cracks which pass through from the front side to the rear side of the target plate and divide the target plate into adjacent fragments. A process is also provided for producing such a target which is suitable, in particular, for the use of extremely high power densities. A vacuum coating process uses at least one such target as a sputtering target and as a result particularly high power densities can be used on the target during the sputtering.

6 Claims, 2 Drawing Sheets

(51) Int. Cl.
*C23C 14/35* (2006.01)
*C23C 14/06* (2006.01)

(52) U.S. Cl.
CPC .......... *C23C 14/35* (2013.01); *H01J 37/3426* (2013.01); *H01J 37/3467* (2013.01)

(58) Field of Classification Search
USPC .......................... 204/298.12, 298.13, 192.12
See application file for complete search history.

(56) References Cited

U.S. PATENT DOCUMENTS

| | | | | |
|---|---|---|---|---|
| 4,901,904 | A | * | 2/1990 | Tsuno .................. B23K 35/004 228/121 |
| 2002/0155016 | A1 | | 10/2002 | Wilhartitz et al. |
| 2004/0020769 | A1 | * | 2/2004 | Ivannov .............. C23C 14/3407 204/298.12 |
| 2010/0183900 | A1 | * | 7/2010 | Wallin .................. C23C 14/081 428/698 |

FOREIGN PATENT DOCUMENTS

| | | | |
|---|---|---|---|
| CN | 101879640 | A | 11/2010 |
| CN | 102039459 | A | 5/2011 |
| CN | 102285791 | A | 12/2011 |
| EP | 1335995 | A1 | 8/2003 |
| JP | S62278261 | A | 12/1987 |
| JP | S63241167 | A | 10/1988 |
| JP | 2005-213073 | * | 1/2004 |
| KR | 2012-0080582 | | 7/2012 |

\* cited by examiner

SPUTTERING TARGET

BACKGROUND OF THE INVENTION

Field of the Invention

The invention relates to a target, which is particularly suitable as a sputtering target, for the use of very high power densities during sputtering of the target and a process for the production thereof.

Targets according to the invention can be employed in many different physical gas phase deposition processes (usually and in the following also called PVD—physical vapor deposition—processes) by means of which coating layers are deposited from the gas phase, for example by using electric arc vaporization or atomization (already above and hereinafter also referred to as sputtering). In particular, the invention therefore not only but particularly relates to sputtering targets which are suitable to be used in a PVD sputtering process for the deposition of coating layers on a substrate material provided for this purpose.

In recent years, sputtering targets consisting of brittle materials or containing brittle materials have increasingly been employed. The use of sputtering targets which can be assigned to a group of materials referred to as brittle represents a great challenge in sputtering. In particular, the application of high sputtering powers or high power densities requires a very good cooling of the target in order to avoid thermally induced mechanical stress, or stresses which can lead to fracture of the target.

For the purposes of the present description, the term brittle refers to materials which break without or with only low plastic deformation close to the elasticity limit. These materials and therefore also the sputtering targets produced therefrom thus have only a low plastic deformation capability.

For this reason, such sputtering targets are firstly relatively difficult to machine and because of that it is very difficult to achieve complex geometries as can be necessary for installation in various coating plants. Machining of such targets made of brittle materials can often only be carried out by means of grinding and wire erosion, and this once again has the consequence that only simple geometries (disks, plates) can be made.

Such targets are subjected to mechanical and thermomechanical loads during their use as sputtering targets in a coating plant and these lead to bending and/or tensile stresses. In the case of brittle materials, these stresses often lead to failure by fracture since the deformation capability is low. The mechanical and thermomechanical loads can result firstly from the pressure of the cooling water on the rear side of the target and/or secondly from the expansion of the material due to the thermal power which is introduced into the sputtering target during the sputtering process. This sometimes only locally introduced thermal power can also lead to stresses which result from local temperature gradients. Combined with an often poor thermal shock resistance of these materials, these factors often lead to formation of cracks and consequently to failure of the sputtering target by fracture.

Examples of such brittle materials for sputtering targets are ceramic materials, in particular borides, nitrides, carbides, silicides, oxides and also metallic brittle materials such as Cr or Si and also mixtures of these materials. These brittle materials usually have a plastic elongation at break of less than or equal to 2%, often even less than or equal to 0.2%.

When targets are used as sputtering targets in a PVD coating plant, high temperatures and/or large temperature gradients caused by introduction of high power densities of >10 W/cm$^2$ frequently occur, as mentioned above. Temperatures and temperature gradients produced in this way have to be controlled or avoided by conducting the thermal energy away through the sputtering target to the cooling plate and exert a high cyclic thermal load on the sputtering target.

Efficient cooling of the sputtering target in the PVD coating plant is made possible for example by using cooling water. In such PVD coating plants, the sputtering targets used are usually cooled by means of flexible cooling plates arranged on the rear side of the sputtering target. As already mentioned above, these cooling plates exert a pressure on the sputtering target which can in turn lead to deformation of the sputtering target or, if the strength of the latter is low, to fracture. This effect is additionally increased by decreasing of the thickness of the sputtering target as a result of erosion of the target surface during the sputtering process. This has the consequence that deformation and/or fracture of the sputtering target can most probably occur.

In general, the mechanical stability (strength and ductility) of the target material group mentioned (brittle materials) is not sufficient to alone bear the mechanical load. In addition, a complex shape, e.g. holes, drilled openings or bayonets, which is frequently required for fastening a sputtering target in an appropriate coating plant can be achieved only with great difficulty and only with high costs.

In the case of targets, composed of brittle materials, for example ceramic materials which are used as sputtering targets, it is therefore usual to equip these with a back plate. The brittle material which is to be sputtered is then designed as target plate. The back plate shall serve to increase the strength (yield point, fracture strength) and to increase the ductility (elongation at break, fracture toughness) of the sputtering target compared to a sputtering target without back plate. A back plate of this type firstly makes it possible to circumvent complicated working of the rear side of the brittle material of the sputtering target (actually of the target plate composed of brittle material) and secondly to reduce the mechanical load due to the pressure of the cooling water (with the proviso that the material of which the back plate is made has a greater stiffness than the material of which the target plate is made).

The strength and ductility of the sputtering target are thus increased by application of a back plate, so that the sputtering target does not deform or deforms only insignificantly and does not fail by fracture when used in a PVD coating plant. Such cases of failure are largely avoided by application of a back plate having increased strength or ductility.

The back plate can also serve as heat sink, i.e. the heat generated on the side of the sputtering target facing the substrate (front side) during the sputtering process can be more readily removed via the target as a result of the application of a back plate having an increased thermal conductivity compared to the material of the target plate. An example of such a heat sink is given in EP 1 335 995 A1.

The application of target plates for sputtering targets composed of brittle materials to back plates composed of particularly stiff materials or materials having a particularly good thermal conductivity is usually effected by bonding (also called soldering). Bonding is carried out using low-melting solders based on indium or tin. Such back plates are made, for example, of copper (material with high thermal conductivity) or molybdenum (material with high stiffness).

Since the soldering of target plates for sputtering targets onto back plates is carried out at temperatures above room temperature, the coefficients of thermal expansion of the back plates are usually matched to those of the target plate materials. This leads to stresses which arise in the composite material of the sputtering target (interface target plate/back plate) after cooling from the soldering temperature to room temperature being able to be minimized.

A further possible way of applying target plates for sputtering targets composed of brittle materials to appropriate back plates is adhesive bonding to back plates composed of, for example, copper by means of heat-resistant and both electrically and thermally conductive adhesives.

As an alternative, the target plates for sputtering targets can also be mechanically clamped to an appropriate back plate. Here, an intermediate foil composed of graphite or silver can be additionally clamped between the target plate and the back plate (e.g. composed of copper) in order to improve the thermal conductivity.

However, all these targets have the disadvantage that they can fail, when they are used as sputtering targets, when high sputtering powers or power densities are introduced into the target during sputtering of the target. Therefore, the employable sputtering power is limited. In some cases the temperature in the sputtering target becomes too high and the solder or adhesive bond fails thermally when high power densities are introduced. In other cases, as mentioned above, deformation or fracture of the sputtering target can occur due to high sputtering powers.

BRIEF SUMMARY OF THE INVENTION

It is an object of the present invention to make possible the implementation of coating processes by means of sputtering of targets composed of one or more brittle materials by using high sputtering powers or high power densities compared to the prior art.

It is a further object of the present invention to provide a target which can be used as a sputtering target for the implementation of sputtering processes using high sputtering powers or high power densities. Such a target should be simple to produce and be mechanically and thermally stable.

It is also a further object of the present invention to provide a process which allows for a simple production of the mechanically and thermally stable sputtering target which can be used for the implementation of sputtering processes using high sputtering powers or power densities.

The present invention eliminates the above-mentioned problems and limitations by providing a sputtering target which can be operated at high sputtering powers or power densities in the sputtering process without being destroyed and thus becoming unusable for further use.

The invention provides a sputtering target comprising a target plate which has a front side and rear side and is composed of a brittle material, wherein the target plate is joined over its area to a back plate and the target plate has microcracks which go through from the front side to the rear side and divide the target plate into adjoining fragments.

The material of the target plate (material A) has a higher coefficient of thermal expansion than the material of the back plate (material B). Hence, the target plate is under tensile load over at least a middle part, leading to the formation of the microcracks in the target plate.

The length and width of the fragments is preferably on average in the order of magnitude of the thickness of the target plate.

The microcracks result in fewer stresses occurring in the case of a high power density introduced during the sputtering process since the edges of the fragments can move relative to one another.

How a sputtering target according to the invention can be produced is explained below by way of example and with the aid of the figures. This is done for the example of a ceramic sputtering target, in this case $TiB_2$, bonded to a mechanically stable back plate, in this case composed of molybdenum, in such a way that microcracks which lead to reduction of mechanical tensile stresses are formed by the bonding process.

It may be pointed out once more that the use of ceramic sputtering targets which can be assigned to a group of materials which are designated as brittle represents a great challenge in sputtering. In particular, the use of high sputtering power (introduction of high power densities) requires very good cooling in order to avoid thermally induced mechanical stress (stresses which can lead to fracture of the target). In order to be able to ensure good cooling, the target is often subjected to a high cooling water pressure via a flexible membrane. This leads to a mechanical bending load on the target. In general, the mechanical stability (strength and ductility) of the target material group mentioned (brittle, in particular ceramic, sputtering targets) is not sufficient to alone be able to bear the mechanical load.

In addition, a complex shape, e.g. holes, drilled openings or bayonets, which is frequently required for fastening a sputtering target in an appropriate coating plant can be achieved only with great difficulty and only with high costs. Target plates composed of the brittle (e.g. ceramic) materials group are therefore fixed to a back plate by means of a bonding process (soldering process).

Preferred shapes of a sputtering target according to the invention are circular or rectangular plates, and preferred dimensions are diameters of from about 50 to 300 mm or dimensions in the order of magnitude of 50 to 1000 mm.

The sputtering target can thus be produced in the following way:

provision of a target plate, preferably comprising a brittle material as main constituent, provision of a back plate, effective bonding over an area of the target plate and the back plate, preferably by soldering at a temperature in the range of 400° C. to 1000° C., and cooling of the target in order to produce a target plate-back plate composite.

Here, the material of the back plate has, compared to the material of the target plate, the following properties:

low coefficient of thermal expansion, higher strength (yield point or 0.2 elongation limit or tensile strength).

Furthermore the material of the back plate has, in advantageous embodiments, the following properties compared to the material of the target plate:

higher modulus of elasticity, higher thermal conductivity.

Target plate and back plate are joined to one another in order to produce the sputtering target of the invention.

The bonding solder is only a few tenths of a millimeter thick and performs the functioning of heat conduction and mechanical bonding of the target plate to the back plate.

The target plate can have a simple shape such as a disk or rectangular plate.

The bonding process has to meet the following requirements:

full-area wetting of the bonding material (bonding solder) in order to allow a homogenous temperature distribution on the target plate. If full-area wetting is not achieved, the heat transfer from the target plate to the back plate is restricted, so that the sputtering target is heated strongly and the bonding solder thus also reaches a high temperature. If the melting point of the bonding solder is exceeded, this can lead to the target plate becoming completely separated from the back plate. In the case of an inhomogeneous temperature distribution, thermally induced mechanical stresses can occur and these can lead to fracture (in this case failure by detachment of broken-out pieces) of the target plate.

Good thermal conductivity of the bonding material.

High adhesive strength.

High melting point of the bonding material in order to be able to employ a high sputtering power density.

The following processes are customary at the present time for bonding a brittle, in particular ceramic, target plate to a back plate:

1. Indium Bonding:

Advantage: very simple to employ, high thermal conductivity of the indium bonding solder Disadvantage: the melting point of indium is 156° C., and only a low power density is therefore possible in the sputtering process.

2. AgSn (Silver-Tin Solder) Bonding:

Advantage: somewhat higher melting point than that of indium, namely 220° C.

Disadvantage: more difficult to employ, wetting and full-area application more difficult. Possible use of the expensive "Nanofoil" process, lower thermal conductivity.

3. Adhesive Bonding Using Electrically and Thermally Conductive Adhesives:

Advantage: higher heat resistance

Disadvantage: low thermal conductivity and therefore higher temperature of the target in the sputtering process, which in turn can, in the case of thermal stability of the adhesive limited to a particular temperature, lead to failure of the bond.

In indium bonding, for example, the sputtering power density which can be employed is limited to about 5-10 W/cm$^2$ by the low melting point when indium solder is used or by non-full-area wetting by the bonding solder or by poor thermal conductivity of the bonding solder, combined with the brittle properties of ceramic target plates. The coating rates which can be achieved are low.

The present invention describes a sputtering target and a method of producing it. The brittle, in particular ceramic, target plate should be joined to the back plate in a high-temperature-resistant manner, with fine microcracks being formed in the target plate after the bonding process as a result of thermal mismatching due to different coefficients of expansion of the target plate and the back plate. The coefficient of thermal expansion of the target plate has to be greater than that of the back plate.

The bonding of a brittle, in particular ceramic, target plate to a back plate is to be achieved by a vacuum soldering process (http://de.wikipedia.org/wiki/Vakuumlöten) at high temperatures (also known as "high-temperature soldering"). The vacuum soldering process usually takes place at 400-1000° C.

In high-temperature soldering, preference is given to using solders which have a melting point above 400° C., preferably above 600° C. and more preferably above 900° C. and up to about 1200° C. The soldering process preferably takes place under reduced pressure to avoid damage by oxidation. The solder can be provided in the form of a solder foil or a solder paste. On cooling from the soldering temperature, tensile stresses arise in the target plate due to the difference in the coefficients of thermal expansion between the target plate and the back plate and these lead to formation of microcacks. This occurs provided that the tensile stresses arising in the target plate as a result of the cooling process exceed the yield point of the material of the target plate and the expansions resulting therefrom cannot occur plastically. An additional condition is a technically correct, good areal bonding of the target plate to the back plate.

The hard soldering of the target to the back plate can be carried out without applied pressure in a vacuum furnace.

If, for example, the target plate is composed of TiB$_2$ and the back plate is composed of molybdenum, a tensile stress will arise in the target plate after the bonding process and cooling of the sputtering target (composite of target plate/back plate) owing to the different coefficients of thermal expansion of TiB$_2$ and Mo.

The coefficient of expansion of TiB$_2$ is 8.1 µm/° C., and that of molybdenum is 4.8 µm/° C.

The sputtering target can optionally be particle-blasted (e.g. by sandblasting) after soldering. This manufacturing step serves firstly to clean the sputtering target of excess solder, and secondly it can have a supporting effect for the formation of the microcracks in the target plate.

The impingement of the blasting material (e.g. sandblasting using α-alumina grains) introduces stresses into the surface of the target plate and due to the lack of ability of the material to undergo plastic deformation finely distributed microcracks are formed. It is also possible for microcracks to be additionally initiated due to impingement of the blasting material. In this case, the elastic deformations arising in the back plate after cooling from the soldering temperature are at the same time dissipated because the target plate which is responsible for the stresses has, as described above, acquired microcracks. This reduces the bending stresses in the sputtering target (bond between target plate/back plate).

It is also possible for microcracks of this type to be formed only or additionally during use of the sputtering target in a coating plant, e.g. as a result of inhomogeneous heat input.

After use of the sputtering target or when the maximum life is reached, the target plate can be separated from the back plate by heating the sputtering target to temperatures above the melting point of the solder, so that the back plate can be reused for a fresh sputtering target.

The sputtering target produced by a process according to the invention can be used at very high sputtering power densities since the target plate is bonded to the back plate by means of a solder which is stable up to very high temperatures and has a good thermal conductivity.

The sputtering target produced by a process according to the invention is insensitive to high pressures exerted by the cooling water on the rear side of the sputtering target since it is provided with a back plate which has a high stiffness and a high strength.

The above-described sputtering target and also the above-described manufacturing route can, for example, also be employed particularly advantageously for the following material pairings (target plate/back plate):

Target plate: Borides (e.g. TiB$_2$, CrB$_2$, WB), carbides (e.g. WC, TiC, SiC), nitrides (e.g. TiN, AlN), silicides (e.g. TiSi$_2$, CrSi$_2$), oxides, composites containing borides, carbides, nitrides, silicides, oxides, metals (e.g. Mo, W, Ti, V, Zr), elemental brittle materials such as Si, Cr, Ge.

Back plate: molybdenum, molybdenum alloys, molybdenum composites, tungsten, tungsten alloys, tungsten composites.

DESCRIPTION OF THE INVENTION

Figure 1:
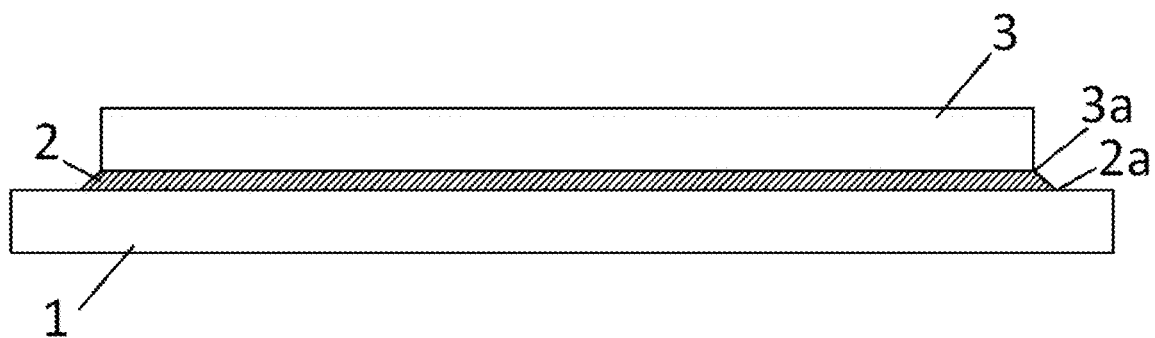
FIG. 1 is a diagrammatic, side-elevational view of a sputtering target during a vacuum soldering process.

FIG. 1: Sputtering target (composite of target plate/back plate) during the vacuum soldering process
1 . . . Back plate
2 . . . Bonding solder
3 . . . Brittle, in particular ceramic, target plate
2a . . . Contact surface of the back plate
3a . . . Contact surface of the target plate The target plate (1) lies on the back plate (3). At high temperatures, the bonding solder (2) melts and wets the contact surfaces 3a and 2a completely.

Figure 2:
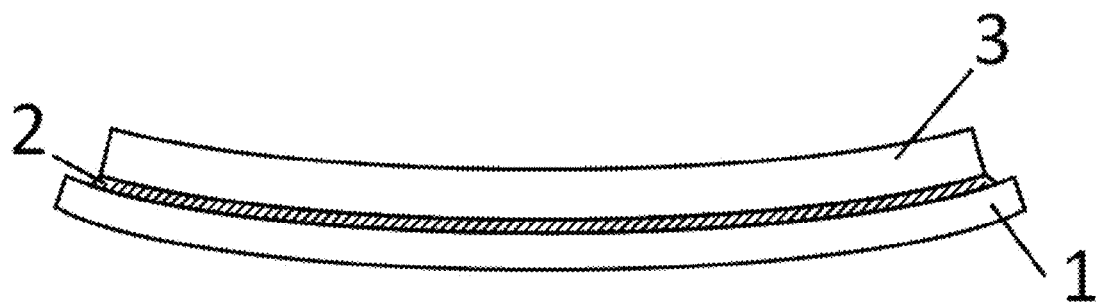
FIG. 2 is a side-elevational view of the sputtering target after bonding in the vacuum soldering process and subsequent cooling.

FIG. 2: Sputtering target (composite of target plate/back plate) after bonding in the vacuum soldering process and subsequent cooling in the atmosphere, using $TiB_2$ as target plate (3) and molybdenum as back plate (1)

As a result of the different coefficients of thermal expansion of $TiB_2$ and Mo, tensile stresses arise in the target plate $TiB_2$ and these lead to curvature of the sputtering target (composite of target plate/back plate) (here shown greatly exaggerated).

Figure 3:
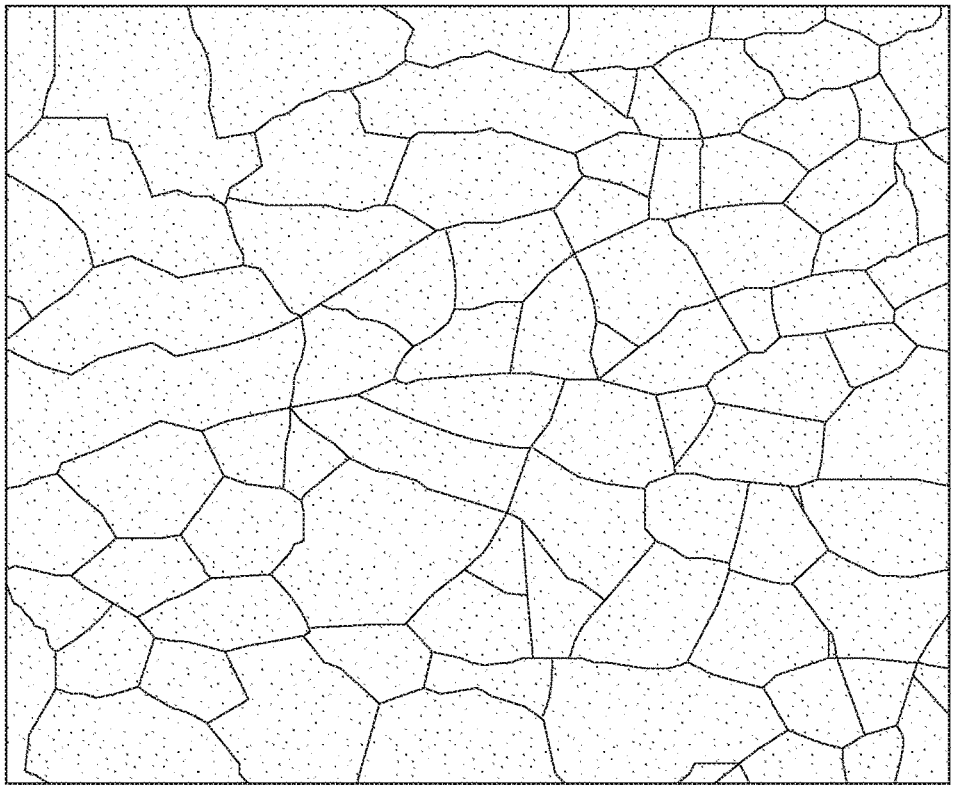
FIG. 3 is a photograph of the sputtering target after the soldering process and a first sputtering.

FIG. 3: Target after soldering process and first sputtering; fine microcracks cover the target. The solder remains intact, i.e. the thermal and mechanical connection of the target plate to the back plate is excellent.

Figure 4:
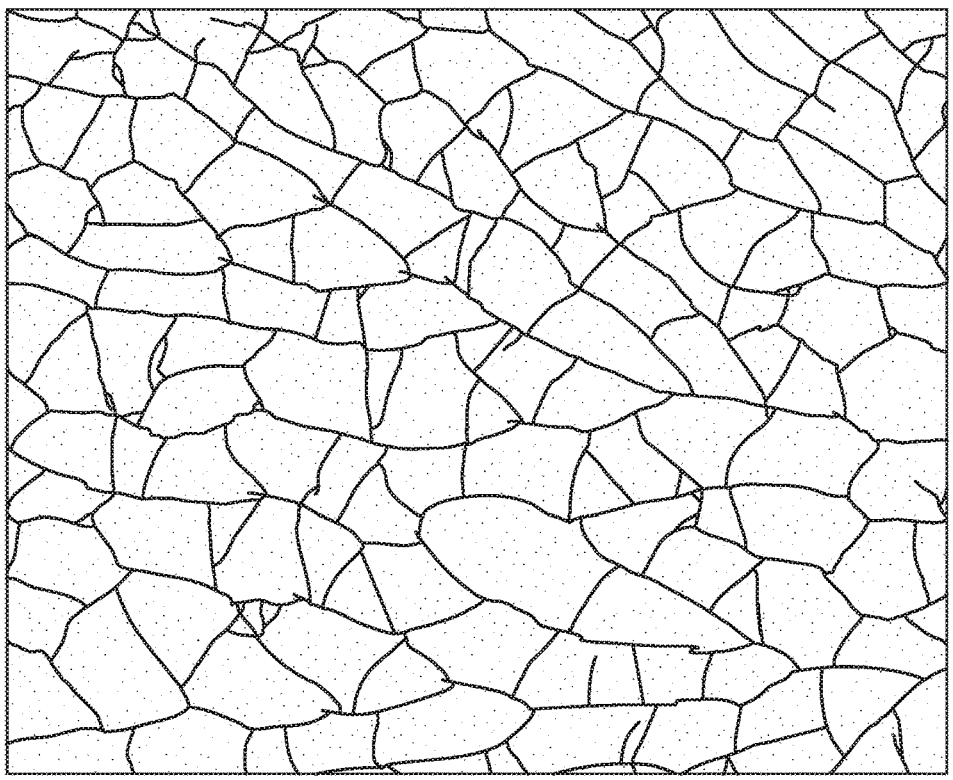
FIG. 4 is a photograph of the sputtering target after a high-power sputtering test.

FIG. 4: Surface of the $TiB_2$-molybdenum sputtering target (composite of target plate/back plate) after a high-power sputtering test for 30 hours at a power density of 45 W/cm$^2$.

The present invention also discloses a vacuum coating process in which at least one target is used as a sputtering target for coating at least one surface of a substrate to be coated via sputtering of the target, whereas The target has a target plate to be sputtered composed of a material A having a front side and a rear side and the target has a back plate composed of a material B having a side facing the target plate, whereas the side of the back plate facing the target plate is mechanically stable bonded over an area to the rear side of the target plate, and a material C is provided between the material A and the material B as joining material, whereas The material A is at least mainly composed of one or more brittle materials and the material B is at least mainly composed of one or more materials having a higher ductility compared to the brittle materials of material A The coefficient of thermal expansion of the material A is higher than the coefficient of thermal expansion of the material B and the material B has a higher ductility and/or strength than the material A The target plate is under tensile stress at least at room temperature in such a way that this leads to the formation of microcracks which go through from the front side to the rear side of the target plate and divide the target plate into adjoining fragments, in such a way that during the introduction of a sputtering power in order to sputter the target plate the edges of the fragments move relative to each other, so that lower stresses occur inside the target plate compared to a target without microcracks and a higher sputtering power can be used without failure of the target plate.

The inventive vacuum coating process particularly can be implemented so that the material A is mainly composed of TiB2 and the material B is mainly composed of Mo and the back plate is bonded to the target plate via soldering at a temperature of between 400° C. and 1000° C.

According to a preferred embodiment the inventive vacuum coating process is implemented so that the deposition process is executed via high-power impulse magnetron sputtering (HIPIMS) of the target.

The invention claimed is:

1. A target or sputtering target, comprising:
a target plate formed of a material having a plastic elongation at break of less than or equal to 2%, said target plate having a front side and a rear side, said target plate including at least a ceramic material as a constituent; and
a back plate connected over an area to said target plate;
said target plate having a contact surface facing said back plate and said back plate having a contact surface facing said target plate;
a bonding solder disposed between said contact surface of said target plate and said contact surface of said back plate, said bonding solder having a melting point greater than 400° C.;
said target plate having a coefficient of thermal expansion being higher than a coefficient of thermal expansion of said back plate; and
said target plate having micro cracks passing through from said front side to said rear side and dividing said target plate into adjoining fragments.

2. The target according to claim 1, wherein said target plate has a thickness, and said fragments of said target plate have a length and a width being on average on the order of magnitude of said thickness of said target plate.

3. The target according to claim 1, wherein said target plate has a strength being lower than a strength of said back plate.

4. A vacuum coating process using at least one target as a sputtering target for coating at least one surface of a substrate to be coated by sputtering the target, the process comprising the following steps:
providing the target with a target plate to be sputtered being formed of a material A including at least a ceramic material as a component and having a front side and a rear side;
providing the target with a back plate formed of a material B having a side facing the target plate;
mechanically bonding the side of the back plate facing the target plate over an area to the rear side of the target plate by providing a material C between the material A and the material B as a joining material, the joining material C having a melting point above 400° C.;
at least forming the material A of one or more materials having a plastic elongation at break of less than or equal to 2% and at least forming the material B of one or more materials having a higher ductility than the materials of the material A;

providing the material A with a coefficient of thermal expansion being higher than a coefficient of thermal expansion of the material B and providing the material B with at least one of a higher ductility or a higher strength than the material A; and placing the target plate under tensile stress at least at room temperature leading to a formation of micro cracks passing through from the front side to the rear side of the target plate and dividing the target plate into adjoining fragments causing edges of the fragments to move relative to each other during an introduction of a sputtering power to sputter the target plate resulting in lower stresses inside the target plate compared to a target without micro cracks and permitting a higher sputtering power to be used without a failure of the target plate.

5. The vacuum coating process according to claim 4, wherein the material A includes $TiB_2$, the material B includes Mo and the back plate is bonded to the target plate by soldering at a temperature of between 400° C. and 1000° C.

6. The vacuum coating process according to claim 4, which further comprises coating the at least one surface of the substrate in a deposition process being executed by high-power impulse magnetron sputtering (HIPIMS) of the target.

* * * * *